US006914436B2

(12) United States Patent
Liu et al.

(10) Patent No.: US 6,914,436 B2
(45) Date of Patent: Jul. 5, 2005

(54) ELECTRONIC CALIBRATION CIRCUIT FOR CALIBRATING A NETWORK ANALYZER

(75) Inventors: James C. Liu, Santa Rosa, CA (US); Robert L. Shimon, Santa Rosa, CA (US); Shigetsune Torin, Santa Rosa, CA (US); Kenneth H. Wong, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/355,961

(22) Filed: Jan. 30, 2003

(65) Prior Publication Data

US 2004/0150411 A1 Aug. 5, 2004

(51) Int. Cl.[7] .......................... G01R 35/00; G01D 18/00
(52) U.S. Cl. .......................................... 324/601; 702/85
(58) Field of Search ................................ 324/601, 600, 324/637, 638, 629, 76.19, 76.22, 74, 76.11, 130, 202, 158.1; 702/85, 108, 117, FOR 156; 73/1.01

(56) References Cited

U.S. PATENT DOCUMENTS

| 5,434,511 A | 7/1995 | Adamian et al. |
| 5,467,021 A | 11/1995 | Adamian et al. |
| 5,477,137 A * | 12/1995 | Staudinger et al. ...... 324/158.1 |
| 5,537,046 A | 7/1996 | Adamian et al. |
| 5,548,221 A | 8/1996 | Adamian et al. |
| 5,552,714 A | 9/1996 | Adamian et al. |
| 5,578,932 A | 11/1996 | Adamian |
| 2003/0115008 A1 * | 6/2003 | Doi ............................ 702/117 |
| 2004/0100276 A1 * | 5/2004 | Fanton ........................ 324/601 |

* cited by examiner

Primary Examiner—Anjan Deb
Assistant Examiner—Hoai-An D. Nguyen

(57) ABSTRACT

An electronic calibration circuit for calibrating a network analyzer. The electronic calibration circuit comprises at least one port for coupling the electronic calibration circuit to the network analyzer. A plurality of switching circuits coupled to the port are operable to provide a plurality of impedance states for electronically calibrating the network analyzer, wherein a transmission line couples at least two of the plurality of switching circuits, the transmission line short enough to reduce interactions of impedance mismatches and to reduce transmission loss. The port and the plurality of switching circuits are comprised within an integrated circuit having a package size small enough to avoid cavity resonance at a high frequency.

20 Claims, 6 Drawing Sheets

500

510
Couple a network analyzer to a port of an electronic calibration circuit, wherein the electronic calibration circuit is an integrated circuit comprising a plurality of switching circuits coupled to the port, the plurality of switching circuits operable to provide the plurality of impedance states

520
Provide a portion of the plurality of impedance states at the electronic calibration circuit for calibrating the network analyzer

FIG. 5

ELECTRONIC CALIBRATION CIRCUIT FOR CALIBRATING A NETWORK ANALYZER

FIELD OF INVENTION

Various embodiments of the present invention relate to the field of vector network analysis.

BACKGROUND OF THE INVENTION

Vector network analyzers (VNAs) are used to measure the performance of many types of electrical systems. However, conventional VNAs are subject to measurement errors. Prior to using a conventional VNA, it is necessary to calibrate the VNA to account for any measurement error so as to ensure an accurate measurement. In order to ensure the accuracy of the calibration over a wide frequency range, up to twenty calibration standards may need to be measured.

Historically, mechanical standards were used to calibrate a VNA. A number of mechanical standards are required to be measured individually on the VNA, making it necessary to physically perform each mechanical standard. In particular, it is necessary to physically connect and disconnect the mechanical standard to the VNA for each measurement. Typically, it takes 15–20 minutes to calibrate a VNA using mechanical standards. Due to the amount of time it takes to mechanically calibrate a VNA, particularly in relation to how long it takes for the VNA to measure devices, it is highly desirable to reduce the calibration time.

In order to reduce the time required to calibrate a VNA, electronic calibration has replaced physical calibration for many applications. Electronic calibration devices take several impedance standards with different electrical characteristics, and places them within a module having an electronic switch for switching between the standards. These impedance standards can be mechanical standards or other known impedance devices. Typically, the electronic calibration device only needs to be physically connected to the VNA once. The electronic calibration device then switches all necessary or desired calibration standards to the VNA test ports.

Currently, semiconductor based or solid state electronic calibration devices are available for calibrating VNAs operating at frequencies of substantially 300 kHz to 9 GHz for low frequencies devices and substantially 45 MHz to 26.5 GHz for higher frequency devices. Mechanical switch based electronic calibration devices exist that can operate up to 40 GHz. However, mechanical switches are much slower and less repeatable than solid state switches.

At high frequencies, current electronic calibration devices become unstable, and are thus not usable for calibrating VNAs. In order to provide an electronic calibration device that is operable at high frequencies it has been proposed to insert an iron-embedded epoxy, such as poly-iron, into the cavity of the electronic calibration device to suppress mode excitation. However, when cycled over time and temperature variation, the mode suppression varies. Thus, electronic calibration devices with poly-iron infused cavities are not stable for use in calibration.

As a result of various technological advances and the requirement for increased bandwidth, a vast number of electronic devices operate at frequencies within the range of substantially 26.5 GHz to upwards of 67 GHz. There are VNAs that operate within this range for performing vector analysis on devices operating at high frequencies. In order to calibrate a VNA using mechanical standards for operating at frequencies of greater than 40 GHz, it is necessary to physically calibrate the VNA, individually measuring each mechanical standard. As described above, physically calibrating a VNA using mechanical standards is labor intensive and time-consuming.

SUMMARY OF THE INVENTION

Various embodiments of the present invention, an electronic calibration circuit for calibrating a network analyzer, are described herein. The electronic calibration circuit comprises at least one port for coupling the electronic calibration circuit to the network analyzer. A plurality of switching circuits coupled to the port are operable to provide a plurality of impedance states for electronically calibrating the network analyzer, wherein a transmission line couples at least two of the plurality of switching circuits. The port and the plurality of switching circuits are comprised within an integrated circuit having a package size small enough to avoid cavity resonance at a high frequency.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 5 is a flowchart diagram illustrating a process for electronically calibrating a network analyzer operating at a high frequency in accordance with one embodiment of the present invention.

BEST MODE(S) FOR CARRYING OUT THE INVENTION

Reference will now be made in detail to various embodiments of the invention, examples of which are illustrated in the accompanying drawings. While the invention will be described in conjunction with various embodiments, it will be understood that they are not intended to limit the invention to these embodiments. On the contrary, the invention is intended to cover alternatives, modifications and equivalents, which may be included within the spirit and the scope of the invention as defined by the appended claims. Furthermore, in the following detailed description of the present invention, numerous specific details are set forth in order to provide a thorough understanding of the present invention. However, it will be apparent to one skilled in the art that the present invention may be practiced without these specific details. In other instances, well-known methods, procedures, components, structures and devices have not been described in detail so as to avoid unnecessarily obscuring aspects of the present invention.

Figure 1:
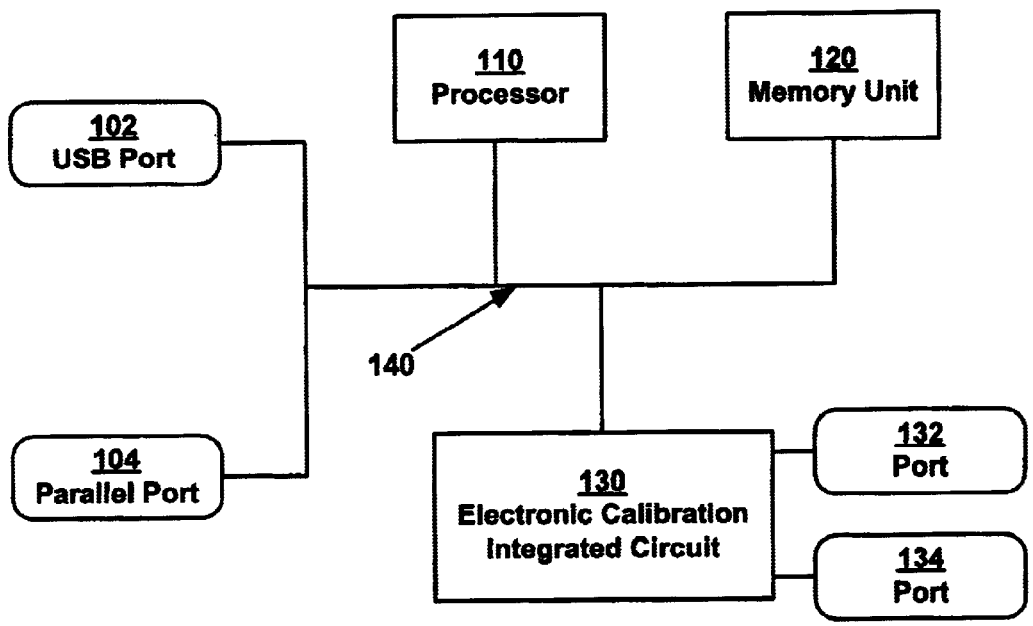
FIG. 1 is a block diagram of an electronic calibration device in accordance with one embodiment of the present invention.

FIG. 1 is a block diagram showing an electronic calibration device 100 in accordance with one embodiment of the present invention. Electronic calibration device 100 is operable to calibrate a network analyzer by determining systematic measurement errors. In various embodiments, the network analyzer is a vector network analyzer (VNA). The measured systematic measurement errors are then removed mathematically from the VNA measurements to provide an accurate measurement for a device.

In one embodiment, electronic calibration device 100 comprises a universal serial bus (USB) port 102 coupled to bus 140 for coupling electronic calibration device 100 to a VNA. USB port 102 provides data transfer capabilities between electronic calibration device 100 and the VNA. In another embodiment, USB port provides power between electronic calibration device 100 and the VNA. In another embodiment, USB port 102 provides control capability for allowing electronic calibration device 100 to control calibration standards. It should be appreciated that electronic calibration device 100 may comprise both USB port 102 and parallel port 104 for providing accessibility to a wider array of VNA models, wherein USB port 102 and parallel port 104 are interchangeable and provide similar functionality for calibrating a VNA.

Electronic calibration device 100 also comprises memory 120, processor 110, and electronic calibration integrated circuit 130 coupled to bus 140. In one embodiment, memory 120 comprises computer readable volatile memory (e.g., random access memory, static RAM, dynamic, RAM, etc.) and/or a computer readable non-volatile memory (e.g., read only memory, programmable ROM, flash memory, EPROM, EEPROM, etc.) for storing information and instructions for processor 110. In one embodiment, memory 120 has stored within data characterizing a plurality of impedance states for use in calibrating the VNA. The plurality of impedance states provides multiple characterized standards used in the calibration of a VNA when applied to electronic calibration integrated circuit 130.

In one embodiment, processor 110 is operable to electronically calibrate the VNA by directing electronic calibration integrated circuit 130 to provide various impedance states of the plurality of impedance states. Electronic calibration integrated circuit 130 comprises a plurality of switching circuits operable to provide a plurality of impedance states for electronically calibrating a VNA greater than 26.5 GHz.

In one embodiment, electronic calibration integrated circuit 130 is coupled to port 132 and port 134. Port 132 and port 134 are configured to be coupled to the VNA, providing connection to multiple impedance states. Systematic errors of the VNA can be determined by computing the difference between the VNA measured response of the impedance standards and the known characteristics of the impedance standards. It should be appreciated that embodiments of the present invention may be implemented such that only one of ports 132 and 134 are coupled to a VNA. Furthermore, it should be appreciated that embodiments of the present invention may comprise n ports, where n is an integer greater than zero, such that multi-port solutions may be provided for more than two ports.

Figure 2:
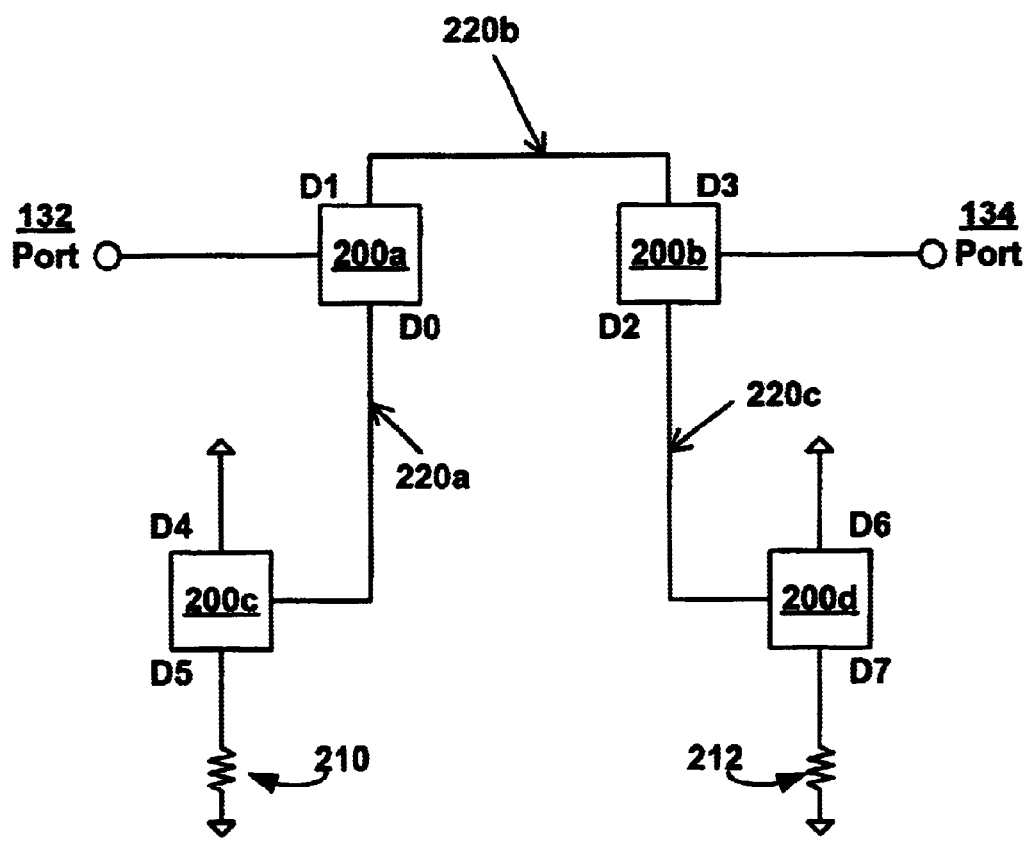
FIG. 2 is a circuit diagram of a multi-state electronic calibration integrated circuit in accordance with one embodiment of the present invention.

FIG. 2 is a circuit diagram of a multi-state electronic calibration integrated circuit 130 in accordance with one embodiment of the present invention. In one embodiment, electronic calibration integrated circuit 130 is implemented as an integrated circuit (IC) device. Electronic calibration integrated circuit 130 is operable to provide a plurality of reflective and transmissive impedance states for calibrating a VNA. By connecting the reflective and transmissive impedance states to a VNA, and comparing the measurements against the known impedance states, the systematic errors of the VNA can be determined according to known calibration techniques, such as those provided in a typical electronic calibration device, such as the Agilent RF Electronic Calibration Device, Product No. 85092C.

Electronic calibration integrated circuit 130 includes a plurality of switching circuits 200a–d configured in such a way as to provide a plurality of reflective and transmissive impedance states. Switching circuit 200 is further described below at FIG. 3. Switching circuits 200a and 200b are coupled to each other by performing standard semiconductor process techniques, thereby limiting the transmission line lengths. Similarly, switching circuits 200a and 200c and switching circuits 200b and 200d are coupled to each other using standard semiconductor process techniques, limiting transmission line lengths. For purposes of simplification and understand, transmission lines 220a–c coupling switching circuits 200a–d are shown in FIG. 2. However, it should be appreciated that the transmission line lengths are on the order of less than 100 microns, due to the switching circuits being implemented in a single integrated circuit. In one embodiment, transmission lines 220a–c have lengths short enough to reduce interactions of impedance mismatches and to reduce transmission loss.

Electronic calibration integrated circuit 130 also comprises port 132 coupled to switching circuit 200a and port 134 coupled to switching circuit 200b. Each switching circuit 200 comprises one input and two outputs. Switching circuit 200a comprises input port 132 and outputs D0 and D1, switching circuit 200b comprises input port 134 and outputs D2 and D3, switching circuit 200c comprises input from D0 and outputs D4 and D5, and switching circuit 200d comprises input from D2 and outputs D6 and D7.

In one embodiment, switching circuit 200c is coupled to ground at D4 and is coupled to resistor 210 at D5. Switching circuit 200d is coupled to ground at D6 and is coupled to resistor 212 at D7. In one embodiment, resisters 210 and 212 are 50 ohm resisters.

As described above, it should be appreciated that embodiments of the present invention may comprise n ports, where n is an integer greater than zero. In one embodiment, an integrated circuit supporting multi-port solutions for more than two ports is provided.

Figure 3:
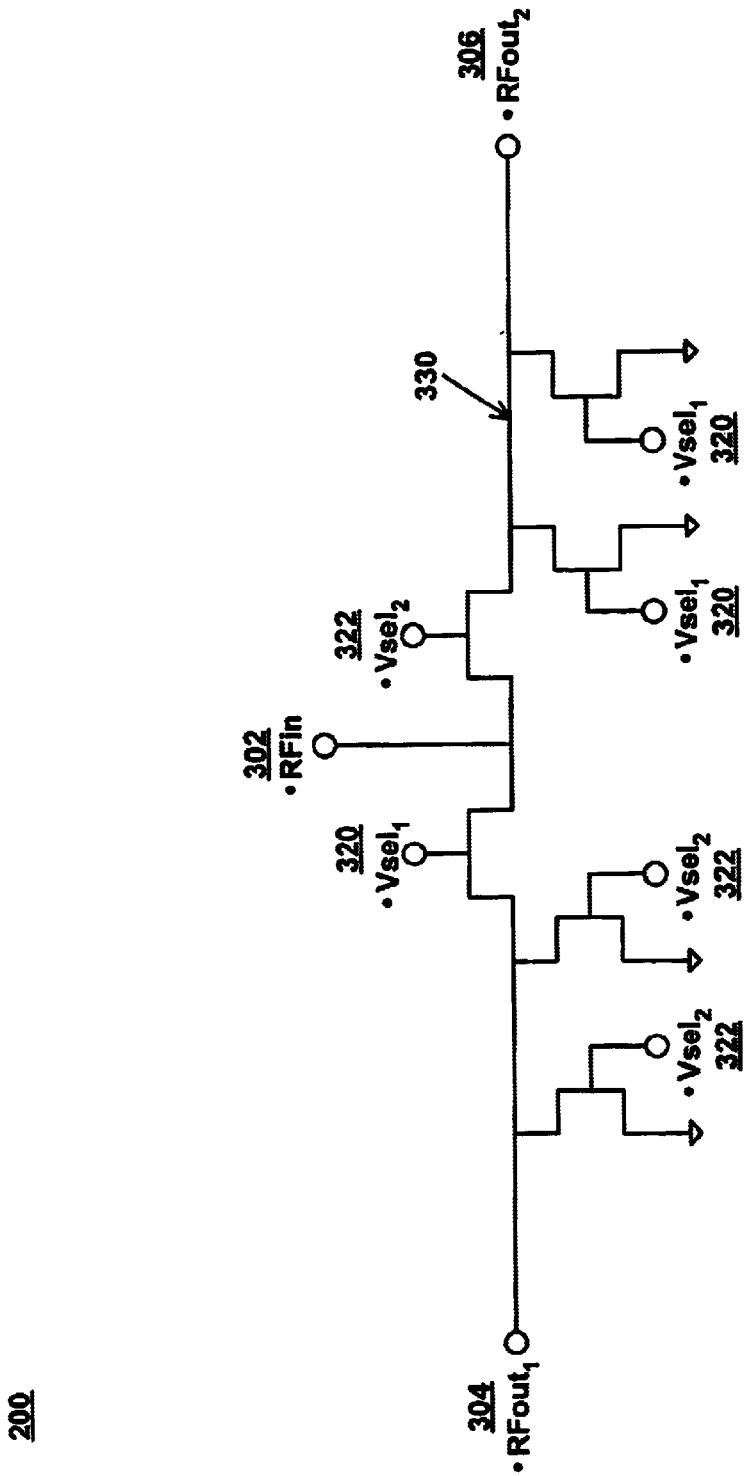
FIG. 3 is a circuit diagram of a switching circuit in accordance with one embodiment of the present invention.

FIG. 3 is a circuit diagram of a switching circuit 200 in accordance with one embodiment of the present invention. Switching circuit 200 is a multi-state switch having four logical states (e.g., RFout$_1$, RFout$_2$, open and short). In one embodiment, switching circuit 200 is a single-pole double-throw (SPDT) switch comprising six field-effect transistors (FETs). Switching circuit 200 comprises input 302 (RFin), output 304 (RFout$_1$) and output 306 (RFout$_2$) coupled to bus 330.

The six FETs of switching circuit 200 are configured as shown in FIG. 3 such that three FETs 320 (Vsel$_1$) are coupled to bus 330 and three FETs 322 (Vsel$_2$) are coupled to bus 330. FETs 320 are controlled by a first control line (Vsel$_1$). Provided the first control line (Vsel$_1$) is set to a logical one, each FET 320 is on. Alternatively, provided the first control line (Vsel$_1$) is set to a logical zero, each FET 320 is off. Similarly, FETs 322 are controlled by a second control line (Vsel$_2$). Provided the second control line (Vsel$_2$) is set to a logical one, each FET 322 is on. Alternatively, provided the second control line (Vsel$_2$) is set to a logical zero, each FET 322 is off.

Switching circuit 200 is operable to provide one of four logical states based on whether each trio of FETs 320 and 322 are on or off. Designing switching circuit 200 as a component of an integrated circuit requires significantly less real estate than discrete solid switches or PIN diodes. In one embodiment, switching circuit 200 is manufactured as an integrated component and has a width of 0.37 millimeters and a length of 0.41 millimeters.

Figure 4A:
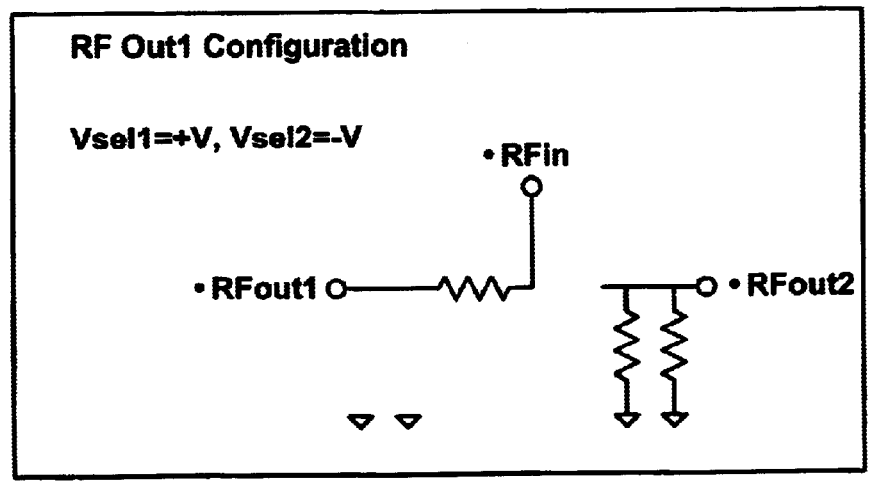
FIGS. 4A–D are state diagrams of a switching circuit in accordance with various embodiments of the present invention.

FIGS. 4A–D are state diagrams of a switching circuit in accordance with various embodiments of the present invention. State diagram 400 of FIG. 4A illustrates a first logical state, the RFout, configuration. In the present embodiment, $Vsel_1$ (e.g., FETs 320 of FIG. 3) is turned on and $Vsel_2$ (e.g., FETs 322 of FIG. 3) is turned off. The common (RFin) connects to $RFout_1$. The FETs controlled by $Vsel_1$ act as resistive transmission lines from RFin to $RFout_1$, while the FETs of $Vsel_2$ act as opens. In order to avoid leakage from $RFout_2$, two FETs of $Vsel_1$ are on, acting as resistive terminations to eliminate signal leakage.

Figure 4B:
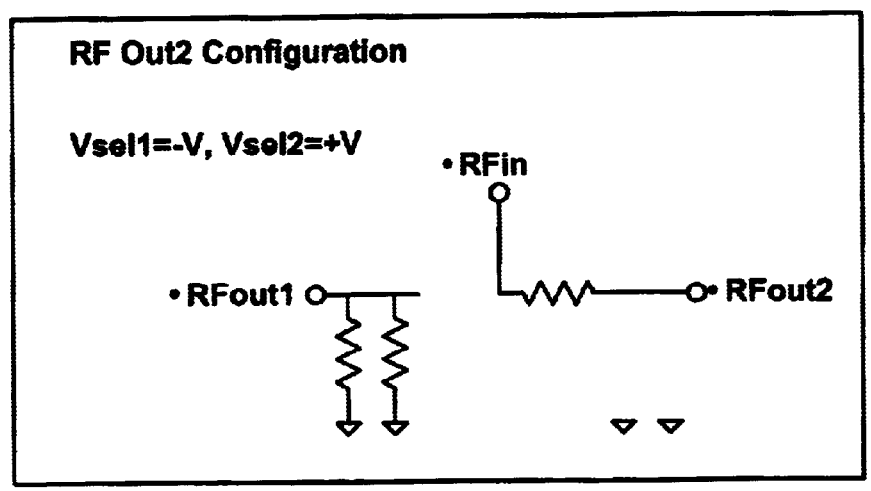

State diagram 420 of FIG. 4B illustrates a second logical state, the $RFout_2$ configuration. In the present embodiment, $Vsel_1$ (e.g., FETs 320 of FIG. 3) is turned off and $Vsel_2$ (e.g., FETs 322 of FIG. 3) is turned on. The common (RFin) connects to $RFout_2$. The load of $Vsel_2$ from RFin to $RFout_2$ is seen with no connection to ground, while the FETs of $Vsel_1$ act as opens. In order to avoid leakage from $RFout_1$, two FETs of $Vsel_2$ are on, acting as resistors to eliminate signal leakage.

Figure 4C:
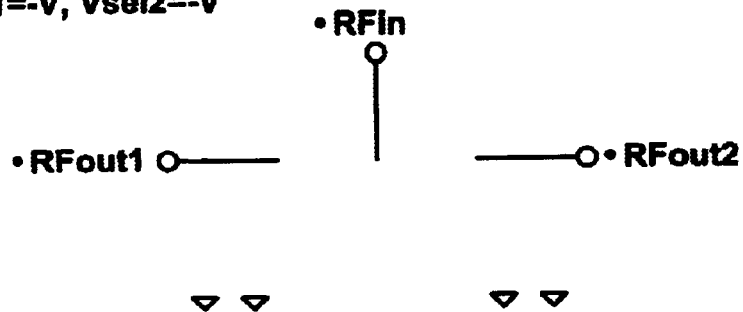

State diagram 440 of FIG. 4C illustrates a third logical state, the off (e.g. open) configuration. In the present embodiment, both $Vsel_1$ (e.g., FETs 320 of FIG. 3) and $Vsel_2$ (e.g., FETs 322 of FIG. 3) are turned off. Since all FETs are off, the switching circuit acts as an open.

Figure 4D:
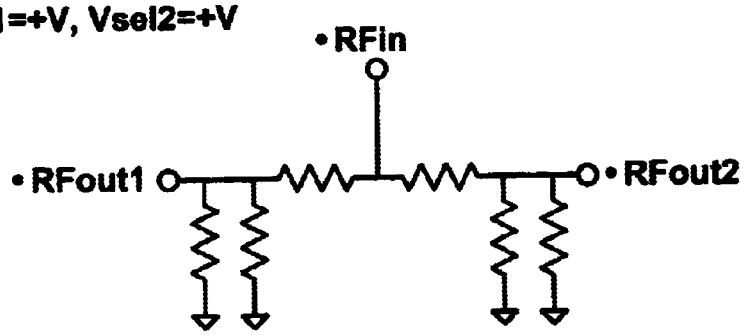

State diagram 460 of FIG. 4D illustrates a fourth logical state, the on (e.g. short) configuration. In the present embodiment, both $Vsel_1$ (e.g., FETs 320 of FIG. 3) and $Vsel_2$ (e.g., FETs 322 of FIG. 3) are turned on. Since all FETs are on, the switching circuit acts as a short.

By arranging switching circuits 200a–d as shown in FIG. 2, seven reflective states for each of port 132 and port 134 are usable. A reflective state is any impedance state that has a finite amount of reflection. Adjusting the coefficient of reflectivity can vary the amount of reflectivity. An impedance state can have low reflectivity (e.g., have a coefficient of reflectivity of close to zero), medium reflectivity (e.g., have a coefficient of reflectivity of close to 0.5), or high reflectivity (e.g., have a coefficient of reflectivity of close to one). Embodiments of the present invention provide two low reflective states per port.

For port 132, the seven reflective states are as follows:
High Reflective States:
  both control lines of switching circuit 200a are set to logical one;
  both control lines of switching circuit 200a are set to logical zero;
Medium Reflective States:
  switching circuit 200a is set to D0 (e.g., state diagram 400 of FIG. 4A) and switching circuit 200c is set to D4 (e.g., state diagram 420 of FIG. 4B);
  switching circuit 200a is set to D0 and switching circuit 200c is set to short (e.g., state diagram 460 of FIG. 4D);
  switching circuit 200a is set to D0 and switching circuit 200c is set to open (e.g., state diagram 440 of FIG. 4C);
Low Reflective States:
  switching circuit 200a is set to D0 and switching circuit 200c is set to D5 (e.g., state diagram 400 of FIG. 4A), providing a load to ground; and
  switching circuit 200a is set to D1 (e.g., state diagram 420 of FIG. 4B) and switching circuit 200b is set to resistive termination.

For port 134, the seven reflective states are as follows:
High Reflective States:
  both control lines of switching circuit 200b are set to logical one;
  both control lines of switching circuit 200d are set to logical zero;
Medium Reflective States:
  switching circuit 200b is set to D2 (e.g., state diagram 400 of FIG. 4A) and switching circuit 200d is set to D6 (e.g., state diagram 420 of FIG. 4B);
  switching circuit 200b is set to D2 and switching circuit 200d is set to short (e.g., state diagram 460 of FIG. 4D);
  switching circuit 200b is set to D2 and switching circuit 200d is set to open (e.g., state diagram 440 of FIG. 4C); and
Low Reflective States:
  switching circuit 200b is set to D2 and switching circuit 200d is set to D7 (e.g., state diagram 400 of FIG. 4A), providing a load to ground;
  switching circuit 200b is set to D3 (e.g., state diagram 420 of FIG. 4B) and switching circuit 200a is set to resistive termination.

In one embodiment, only three reflective states for a port are used to determine the three one-port systematic error terms of a VNA. In another embodiment, up to seven reflective states for a port, including combinations of low, medium and high reflective states, are used to determine three one-port systematic error terms of a VNA, thus improving the calibration accuracy and reducing the needed coverage range of impedance states.

Furthermore, electronic calibration integrated circuit 130 provides two transmissive states.
  Through—switching circuit 200a is set to D1 and switching circuit 200b is set to D3;
  Confidence—switching circuit 200a is set to short and switching circuit 200b is set to short; and In order to eliminate cavity resonance at high frequencies, electronic calibration integrated circuit 130 typically has a width of less than half a wavelength. At very high frequencies, this width is narrow. For instance, at a frequency of substantially 70 GHz, half a wavelength is equal to approximately 2.1 millimeters. In order to avoid cavity resonance, electronic calibration integrated circuit 130 must have a width of less than 2.1 millimeters.

Designing electronic calibration integrated circuit 130 as an integrated circuit manufactured by standard semiconductor process techniques provides for the width that avoids cavity resonances. In one embodiment, electronic calibration circuit has a width of 1.1 millimeters, thereby providing electronic calibration for VNAs operating at a frequency of substantially 70 GHz. The threshold operation frequency is defined by the measurements of the integrated circuit and the cavity, such that as the critical dimensions of the integrated circuit are reduced, the operation frequency increases. It should be appreciated that as technological advances reduce the critical dimensions of semiconductor processing, calibration of VNAs operating at higher frequencies can be performed.

FIG. 5 is a flowchart diagram illustrating a process 500 for electronically calibrating a network analyzer operating at a high frequency in accordance with one embodiment of the present invention. In one embodiment, process 500 is performed by an electronic calibration integrated circuit. Although specific steps are disclosed in process 500, such steps are exemplary. That is, the embodiments of the present invention are well suited to performing various other steps or variations of the steps recited in FIG. 5.

At step 510, a network analyzer is coupled to a port of an electronic calibration circuit (e.g., electronic calibration integrated circuit 130 of FIG. 1). In one embodiment, the electronic calibration circuit is an integrated circuit comprising a plurality of switching circuits coupled to the port, wherein the plurality of switching circuits are operable to provide a plurality of impedance states.

At step 520, a portion of the plurality of impedance states are provided at the electronic calibration circuit for calibrating the network analyzer. In one embodiment, the plurality of impedance states comprises a plurality of reflective states. In another embodiment, the plurality of impedance states comprises a plurality of transmissive states. Once the impedance states are measured, techniques known by those skilled in the art are used to determine systematic measurement errors for use in calibrating the VNA.

Various embodiments of the present invention, an electronic calibration circuit for calibrating a network analyzer, are thus described. While the present invention has been described in particular embodiments, it should be appreciated that the present invention should not be construed as limited by such embodiments, but rather construed according to the below claims.

What is claimed is:

1. An electronic calibration circuit for calibrating a network analyzer, said electronic calibration circuit comprising:
    at least one port for coupling said electronic calibration circuit to said network analyzer;
    a plurality of switching circuits coupled to said port, said plurality of switching circuits operable to provide a plurality of impedance states for electronically calibrating said network analyzer; and
    a transmission line coupling at least two of said plurality of switching circuits, wherein said transmission line is short enough to reduce interactions of impedance mismatches and to reduce transmission loss;
    wherein said port, said plurality of switching circuits, and said transmission line are comprised within a semiconductor integrated circuit.

2. The electronic calibration circuit as recited in claim 1 wherein said electronic calibration circuit is operable for calibrating said network analyzer at a high frequency.

3. The electronic calibration circuit as recited in claim 1 wherein said semiconductor integrated circuit has a package size small enough to avoid cavity resonance at a high frequency.

4. The electronic calibration circuit as recited in claim 2 wherein said high frequency is a frequency greater than 26.5 gigahertz.

5. The electronic calibration circuit as recited in claim 1 wherein said plurality of impedance states comprise a plurality of reflective states.

6. The electronic calibration circuit as recited in claim 5 wherein said plurality of reflective states comprises at least one low reflective state.

7. The electronic calibration circuit as recited in claim 1 wherein said plurality of impedance states comprises a transmissive state.

8. The electronic calibration circuit as recited in claim 1 further comprising at least one resister coupled to at least one switching circuit of said plurality of switching circuits for providing a resistive load to said switching circuit.

9. The electronic calibration circuit as recited in claim 8 wherein said resister has a resistance of 50 ohms.

10. An electronic calibration device for calibrating a network analyzer, said electronic calibration device comprising:
    a bus;
    at least one port coupled to said bus, said port for coupling said electronic calibration device to said network analyzer;
    a memory unit coupled to said bus, said memory unit comprising data characterizing a plurality of impedance states;
    a semiconductor integrated circuit coupled to said bus, said semiconductor integrated circuit comprising a plurality of switching circuits coupled to said port, and a transmission line coupling at least two of said plurality of switching circuits, said plurality of switching circuits operable to provide said plurality of impedance states, wherein said transmission line is short enough to reduce interactions of impedance mismatches and to reduce transmission loss; and
    a processor coupled to said bus, said processor for electronically calibrating said network analyzer by directing said semiconductor integrated circuit to provide an impedance state of said plurality of impedance states.

11. The electronic calibration device as recited in claim 10 wherein said electronic calibration device is operable for calibrating said network analyzer at a high frequency.

12. The electronic calibration device as recited in claim 10 wherein said semiconductor integrated circuit has a package size small enough to avoid cavity resonance at a high frequency.

13. The electronic calibration device as recited in claim 11 wherein said high frequency is a frequency greater than 26.5 gigahertz.

14. The electronic calibration device as recited in claim 10 wherein said plurality of impedance states comprises a plurality of reflective states and at least one transmissive state.

15. The electronic calibration device as recited in claim 14 wherein said plurality of reflective states comprises at least one low reflective state.

16. The electronic calibration device as recited in claim 10 wherein said semiconductor integrated circuit further comprises at least one resister coupled to at least one switching circuit of said plurality of switching circuits for providing a resistive toad to said switching circuit.

17. A method for electronically calibrating a network analyzer operating at a high frequency, said method comprising:
    coupling said network analyzer to a port of an electronic calibration circuit, wherein said electronic calibration circuit is a semiconductor integrated circuit comprising a plurality of switching circuits coupled to said port, and a transmission line coupling at least two of said plurality of switching circuits, said plurality of switching circuits operable to provide a plurality of impedance states, wherein said transmission line is short enough to reduce interactions of impedance mismatches and to reduce transmission loss; and
    providing a portion of said plurality of impedance states at said electronic calibration circuit for calibrating said network analyzer.

18. The method as recited in claim 17 wherein said semiconductor integrated circuit has a package size small enough to avoid cavity resonance at a high frequency.

19. The method as recited in claim 17 wherein said plurality of impedance states comprises a plurality of reflective states.

20. The method as recited in claim 19 wherein said plurality of reflective states comprises at least one low reflective state.

* * * * *

UNITED STATES PATENT AND TRADEMARK OFFICE
CERTIFICATE OF CORRECTION

PATENT NO. : 6,914,436 B2
DATED : July 5, 2005
INVENTOR(S) : Liu et al.

It is certified that error appears in the above-identified patent and that said Letters Patent is hereby corrected as shown below:

Column 8,
Line 41, delete "toad" and insert -- load --.

Signed and Sealed this

Third Day of January, 2006

JON W. DUDAS
*Director of the United States Patent and Trademark Office*